US007932012B2

(12) United States Patent
Komatsu et al.

(10) Patent No.: US 7,932,012 B2
(45) Date of Patent: Apr. 26, 2011

(54) HEAT-RESISTANT PHOTOSENSITIVE RESIN COMPOSITION, METHOD FOR FORMING PATTERN USING THE COMPOSITION, AND ELECTRONIC PART

(75) Inventors: Hiroshi Komatsu, Ibaraki (JP); Nagatoshi Fujieda, Ibaraki (JP); Hajime Nakano, Ibaraki (JP)

(73) Assignee: Hitachi Chemical Dupont Microsystems Ltd., Tokyo (JP)

( * ) Notice: Subject to any disclaimer, the term of this patent is extended or adjusted under 35 U.S.C. 154(b) by 296 days.

(21) Appl. No.: 10/594,548

(22) PCT Filed: Mar. 31, 2004

(86) PCT No.: PCT/JP2004/004666
§ 371 (c)(1), (2), (4) Date: Sep. 27, 2006

(87) PCT Pub. No.: WO2005/101125
PCT Pub. Date: Oct. 27, 2005

(65) Prior Publication Data

US 2008/0233513 A1 Sep. 25, 2008

(51) Int. Cl.
*G03F 7/004* (2006.01)
*G03F 7/30* (2006.01)

(52) U.S. Cl. ....... 430/270.1; 430/14; 430/191; 430/192; 430/193; 430/326; 430/330; 430/906

(58) Field of Classification Search ............... 430/270.1, 430/191, 192, 193, 326, 330, 14
See application file for complete search history.

(56) References Cited

U.S. PATENT DOCUMENTS

| | | | | |
|---|---|---|---|---|
| 4,395,482 | A | 7/1983 | Ahne et al. | |
| 5,756,254 | A * | 5/1998 | Kihara et al. | 430/270.1 |
| 6,071,670 | A * | 6/2000 | Ushirogouchi et al. | 430/270.1 |
| 6,727,049 | B2 * | 4/2004 | Thackeray et al. | 430/326 |
| 6,899,989 | B2 * | 5/2005 | Suzuki et al. | 430/270.1 |
| 6,929,891 | B2 * | 8/2005 | Rushkin et al. | 430/18 |
| 7,060,413 | B2 * | 6/2006 | Thackeray et al. | 430/270.1 |
| 2002/0090569 | A1 * | 7/2002 | Suzuki et al. | 430/270.1 |
| 2003/0203310 | A1 * | 10/2003 | Thackeray et al. | 430/270.1 |

FOREIGN PATENT DOCUMENTS

| | | |
|---|---|---|
| JP | 54-109828 | 8/1979 |
| JP | 60-135935 | 7/1985 |
| JP | 62-127840 | 6/1987 |
| JP | 62-215264 | 9/1987 |
| JP | 11-223940 | 8/1999 |
| JP | 2000-199957 | 7/2000 |
| JP | 2000-305268 | 11/2000 |
| JP | 2001-49119 | 2/2001 |
| JP | 2001-181249 | 7/2001 |
| JP | 2003-026919 | 1/2003 |
| JP | 2003-255535 | 9/2003 |
| JP | 2003-330167 | 11/2003 |

OTHER PUBLICATIONS

Japanese Official Action issued Sep. 2, 2008, in Application No. 2003-054299.

* cited by examiner

*Primary Examiner* — John S Chu

(74) *Attorney, Agent, or Firm* — Antonelli, Terry, Stout & Kraus, LLP.

(57) ABSTRACT

A heat resistant photosensitive resin composition having excellent film properties is provided by constituting a photosensitive resin composition containing (A) a polymer having an acid functional group and/or a substituent derived therefrom, (B) a compound having at least one substituent derived from an amine functional group, (C) a photoreactive compound, and (D) a solvent. Using this composition, a pattern with high resolution can be produced, and thus an electronic part having a high quality can be produced.

13 Claims, 1 Drawing Sheet

Step (a)
Step (b)
Step (c)
Step (d)
Step (e)
6A
6B
6C
1
2
3
4
5
7
8

HEAT-RESISTANT PHOTOSENSITIVE RESIN COMPOSITION, METHOD FOR FORMING PATTERN USING THE COMPOSITION, AND ELECTRONIC PART

TECHNICAL FIELD

The present invention relates to a heat-resistant photosensitive resin composition, and, more particularly, to a material used as a heat-resistant photosensitive material in surface protecting film or interlayer dielectric for semiconductor device.

BACKGROUND ART

In the semiconductor industries, conventionally, inorganic materials have been used in interlayer dielectric materials. However, in recent years, organic materials having excellent heat resistance, such as polyimide resins, are being used taking advantage of their properties in the interlayer dielectric materials.

In forming circuit patterns on semiconductor integrated circuits or printed circuit boards, the pattern formation is achieved through a number of cumbersome steps including formation of a resist layer on the surface of a base material, exposure of predetermined positions, removal of unnecessary portions by etching or the like, and cleaning of the surface of a substrate. Therefore, the development of heat-resistant photosensitive materials that constitute resists at necessary portions which can serve as an insulating material after forming patterns by exposure and development is desired. For meeting such demands, recently, photosensitive polyimide and polybenzoxazole are being mainly used as a resin constituting the resist wherein the resins themselves have photosensitivity and hence can easily form a pattern merely by application, exposure, and development, thus shortening the semiconductor fabrication process. Most of the conventional photosensitive polyimide is of a negative type such that an organic solvent is used as a developer and the exposed portions become insoluble. With respect to the negative photosensitive polyimide which creates contrast by a photo-crosslinking reaction, for example, a method has been proposed in which a compound having a photosensitive group is added to or mixed with an acid functional group of a polyimide precursor (see Japanese Patent Application Laid-open No. S54-109828 A).

On the other hand, demands on alkaline aqueous solution development are increasing recently for lowering the material cost and protecting the environment. As an example of conventional techniques, the use of a naphthoquinonediazide compound as a sensitizer and a polybenzoxazole precursor having an acid functional group as a base resin has been proposed (see Japanese Patent Application Publication No. H1-46862).

In the photosensitive resins, the improvement of development properties is important, and therefore the resin is comprised of a polymer having a low molecular weight for increasing the solubility. However, the polymer having a low molecular weight exhibits only unsatisfactory mechanical properties even after being cured, and thus the conventional photosensitive resin materials have a problem in that they cannot exhibit their advantageous resin properties.

The present invention has been achieved in view of the above problem, and an object of the invention is to provide a resin composition comprising a photosensitive polyimide precursor, polybenzoxazole precursor, polyimide, or polybenzoxazole capable of forming a cured resin having excellent properties, a copolymer thereof, or a mixture thereof; a method for forming a pattern using the resin composition; and an electronic part having an electronic device having the pattern.

DISCLOSURE OF INVENTION

With this situation in mind, the present inventors have conducted intensive studies. As a result, it has been found that, by using a heat-resistant polymer or a precursor thereof having an acid functional group or a substituent derived therefrom and a compound having a substituent derived from an amine functional group in combination, the resin component being cured is presumed to increase in molecular weight, so that a cured resin having desired properties can be formed without sacrificing the development properties.

In the present invention, there are provided a resin composition comprising a photosensitive polyimide precursor, polybenzoxazole precursor, polyimide, or polybenzoxazole capable of forming a cured resin having excellent properties, a copolymer thereof, or a mixture thereof; a method for forming a pattern using the resin composition; and an electronic part having an electronic device having the pattern.

Namely, the present invention is as follows:

[1] A photosensitive resin composition comprising: (A) a polymer having an acid functional group and/or a substituent derived therefrom; (B) a compound having at least one substituent derived from an amine functional group; (C) a photoreactive compound; and (D) a solvent.

[2] The photosensitive resin composition according to [1], wherein the compound of the component (B) further has at least one acid functional group and/or substituent derived therefrom.

[3] The photosensitive resin composition according to [1], wherein the compound of the component (B) has one substituent or two substituents derived from an amine functional group.

[4] The photosensitive resin composition according to [3], wherein the component (B) has one or two acid functional group and/or substituent derived therefrom.

[5] The photosensitive resin composition according to [1], wherein the component (A) further has at least one substituent derived from an amine functional group in itself or in another component (A), and wherein the component (B) further has at least one acid functional group and/or substituent derived therefrom.

[6] The photosensitive resin composition according to [5], wherein the component (A) has one substituent derived from an amine functional group, and wherein the component (B) has one substituent or two substituents derived from an amine functional group and has one acid functional group and/or substituent derived therefrom.

[7] The photosensitive resin composition according to [1], wherein the polymer (A) is a heat-resistant polymer.

[8] The photosensitive resin composition according to [1], wherein the acid functional group in the polymer (A) is a carboxyl group and/or a phenolic hydroxyl group.

[9] The photosensitive resin composition according to [7] or [8], wherein the heat-resistant polymer is a polyimide precursor represented by the general formula (1) below or polyimide derived from the precursor, a polybenzoxazole precursor represented by the general formula (2) below or polybenzoxazole derived from the precursor, a copolymer thereof, or a mixture thereof:

(1)

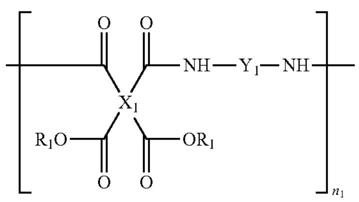

wherein $X_1$ represents a tetravalent organic group, $Y_1$ represents a divalent organic group, $R_1$ represents hydrogen or a monovalent organic group, and $n_1$ represents an integer of 2 to 500 corresponding to the number of the repeating units of the polymer, (2)

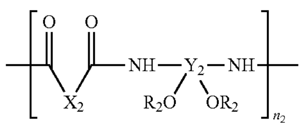

wherein $X_2$ represents a divalent organic group, $Y_2$ represents a tetravalent organic group, of which two valences are used in bonding to hydroxyl groups, $R_2$ represents hydrogen or a monovalent organic group, and $n_2$ represents an integer of 2 to 500 corresponding to the number of the repeating units of the polymer.

[10] A method for forming a pattern, comprising: a step of applying the photosensitive resin composition according to [1] onto a substrate and drying it; a step of subjecting the applied and dried photosensitive resin film to light exposure; a step of subjecting the exposed photosensitive resin film to development using an alkaline aqueous solution; and a step of subjecting the pattern obtained in the development to heat treatment.

[11] An electronic part having an electronic device having the pattern obtained by the method according to [10], wherein the pattern is an interlayer dielectric layer and/or a surface protecting film layer.

The invention according to any one of the items [1] to [8] is directed to a photosensitive resin composition which comprises: (A) a polymer having an acid functional group and/or a substituent derived therefrom; (B) a compound having at least one substituent derived from an amine functional group; (C) a photoreactive compound; and (D) a solvent, and which forms, utilizing an acid functional group or a substituent derived therefrom of a conventional heat-resistant polymer or a precursor thereof, a cured resin having desired properties from the heat-resistant polymer or precursor thereof without sacrificing the development properties.

The invention according to the item [7] has an effect of the invention according to the item [1] and forms a cured resin having more excellent properties, and the invention according to the item [8] is directed to the photosensitive resin composition wherein the acid functional group in polymer (A) is a carboxyl group and/or a phenolic hydroxyl group.

The invention according to the item [9] is directed to the photosensitive resin composition wherein polymer (A) is a polyimide precursor represented by the general formula (1), a polybenzoxazole precursor represented by the general formula (2), polyimide or polybenzoxazole derived from the precursor, a copolymer thereof, or a mixture thereof, and is directed to the resin composition having an effect of the invention according to the item [1], wherein polymer (A) is a photosensitive polyimide precursor, a polybenzoxazole precursor, polyimide, polybenzoxazole, a copolymer thereof, or a mixture thereof, which forms a cured resin having more excellent properties.

The invention according to the item [10] is directed to a method for forming a pattern using the heat-resistant photosensitive resin composition having an effect of the invention according to the item [1]. The invention according to the item [11] is directed to an electronic part having an electronic device with the pattern obtained by the method according to the item [10] as a surface protecting film layer and/or an interlayer dielectric layer.

BEST MODE FOR CARRYING OUT THE INVENTION

Figure 1:
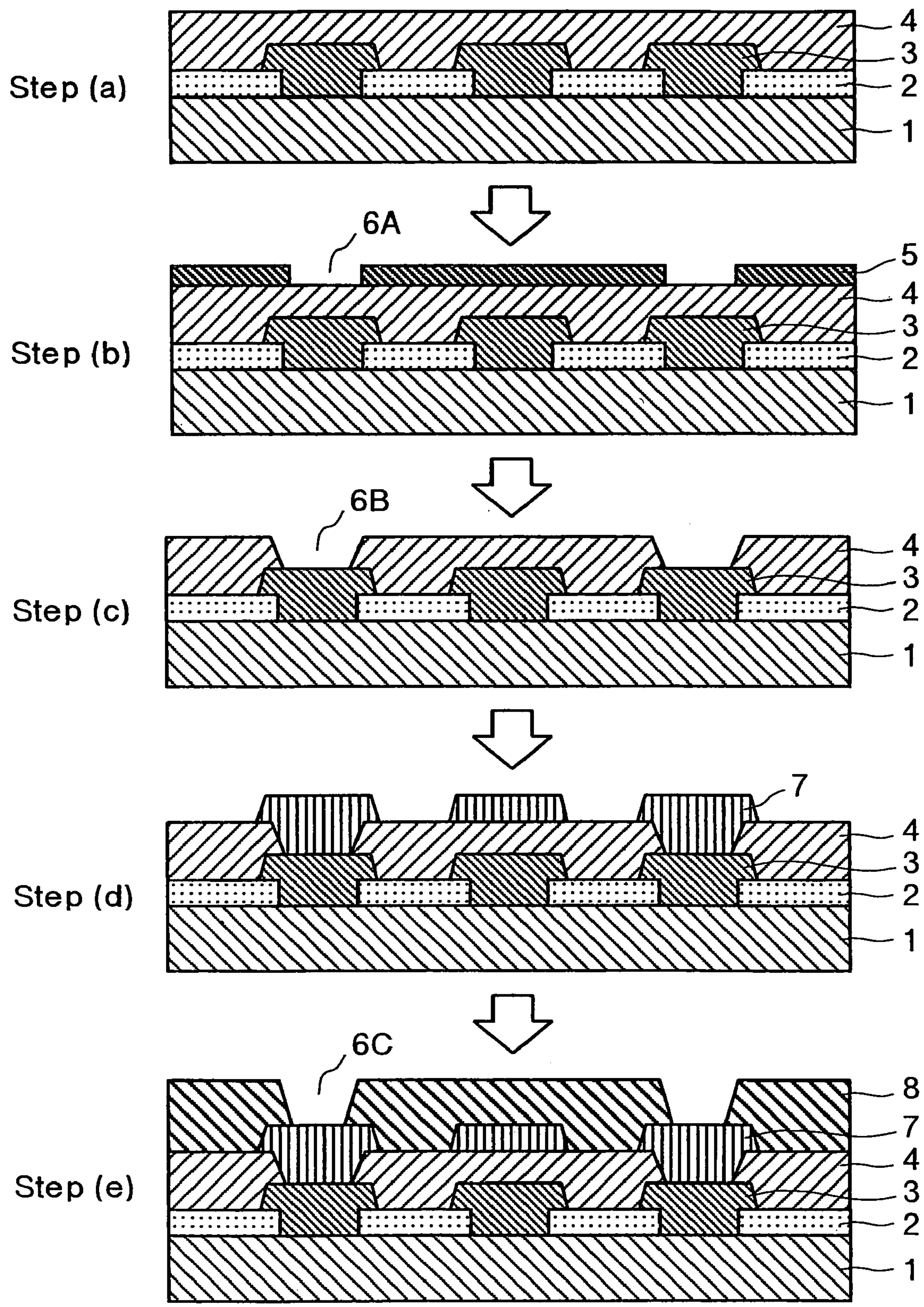
FIG. 1 is a manufacturing process diagram of a semiconductor device of a multilayer wiring structure.

Embodiments of the present invention will be explained below in detail with reference to the accompanying drawing. Note that the invention is not limited to the embodiments.

In the present invention, the essential components include (A) a polymer having an acid functional group and/or a substituent derived therefrom, (B) a compound having at least one substituent derived from an amine functional group, (C) a photoreactive compound, and (D) a solvent. It is considered that component (B) is reacted with the acid functional group and/or substituent derived therefrom in component (A) due to heating to cause polymer (A) to have a higher molecular weight.

With respect to component (A) in the present invention, examples of the polymers having an acid functional group and/or a substituent derived therefrom may include polyimide precursors obtained from a tetracarboxylic dianhydride and a diamine, polybenzoxazole precursors obtained from a dicarboxylic acid and a bisaminophenol, copolymers thereof, and mixtures thereof. The polymer has in its molecule an acid functional group, such as a carboxylic acid group or an aromatic hydroxyl group, and/or a substituent derived therefrom, and can further have a substituent derived from an amine functional group. It is considered that the molecular weight of the polymer of component (A) can be increased utilizing the functional group.

For example, the compound of component (B) having at least one substituent derived from an amine functional group is reacted with the polymer of component (A) to increase the molecular weight of the polymer. It is considered that, for example, the compound having at least one substituent derived from an amine functional group and being bonded to the polymer is further reacted with the polymer or a polymer of another component (A), that is, the compound forms crosslinking in the polymer molecules or between the polymer molecules to further increase the molecular weight of the polymer of component (A). With respect to the manner for increasing the molecular weight of the polymer of component (A), there is no particular limitation.

Examples of tetracarboxylic dianhydrides may include pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3-dicarboxyphenyl)

propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)sulfone dianhydride, bis(3,4-dicarboxyphenyl)ether dianhydride, 1,2,3,4-cyclopentanetetracarboxylic dianhydride, 2,2-bis[4-(4-aminophenoxy)phenyl]propane, 1,2,5,6-naphthalenetetracarboxylic dianhydride, 2,3,6,7-naphthalenetetracarboxylic dianhydride, 2,3,5,6-pyridinetetracarboxylic dianhydride, 3,4,9,10-perylenetetracarboxylic dianhydride, 3,3',4,4'-tetraphenylsilanetetracarboxylic dianhydride, 2,2-bis(3,4-dicarboxyphenyl)hexafluoropropane dianhydride, N-(trimellitic dianhydride)-2,2'-bis(3-amino-4-hydroxyphenyl)hexafluoropropane, N-(trimellitic dianhydride)-2,2'-bis(3-amino-4-hydroxyphenyl)propane, N-(trimellitic dianhydride)-4,4'-diamino-3,3'-dihydroxybiphenyl, N-(trimellitic dianhydride)-2,2'-bis(3-amino-4-hydroxyphenyl)sulfone, N-(trimellitic dianhydride)-2,2'-bis(3-amino-4-hydroxyphenyl)ether, N-(trimellitic dianhydride)-2,2'-bis(3-amino-4-hydroxyphenyl)propane, N-(trimellitic dianhydride)-2,4-diaminophenol, N-(trimellitic dianhydride)-2,5-diaminophenol, and N-(trimellitic dianhydride)-1,4-diamino-2,5-dihydroxybenzene, and these may be used individually or in combination. The tetracarboxylic dianhydride is not necessarily limited to those listed above. The tetracarboxylic dianhydride and the diamine may be used in combination.

Examples of diamines may include 4,4'-diaminodiphenyl ether, 4,4'-diaminodiphenylmethane, 4,4'-diaminodiphenyl sulfone, 4,4'-diaminodiphenyl sulfide, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis[4-(4-aminophenoxy)phenyl]ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 2,2',3,3'-tetraethyl-4,4'-diaminobiphenyl, 2,2'-dimethoxy-4,4'-diaminobiphenyl, 3,3'-dimethoxy-4,4'-diaminobiphenyl, 2,2'-dihydroxy-4,4'-diaminobiphenyl, 3,3'-dihydroxy-4,4'-diaminobiphenyl, 2,2'-di(trifluoromethyl)-4,4'-diaminobiphenyl, 2,4-diaminobenzoic acid, 3,5-diaminobenzoic acid, 3,3'-diaminobiphenyl-5,5'-dicarboxylic acid, 4,4'-diaminodiphenyl ether-5,5'-dicarboxylic acid, 4,4'-diaminodiphenylmethane-5,5'-dicarboxylic acid, 4,4'-diaminodiphenyl sulfone-5,5'-dicarboxylic acid, 4,4'-diaminodiphenyl sulfide-5,5'-dicarboxylic acid, 4,4'-diamino-3,3'-dihydroxybiphenyl, 2,2'-bis(3-amino-4-hydroxyphenyl) propane, 2,2'-bis(3-amino-4-hydroxyphenyl) hexafluoropropane, oxybis(3-amino-4-hydroxyphenyl), bis (3-amino-4-hydroxyphenyl)sulfone, 2,4-diaminophenol, 1,4-diamino-2,5-dihydroxybenzene, N,N'-(4-aminophenylcarbonyl)-3,3'-dihydroxybiphenyl, N,N'-(3-aminophenylcarbonyl)-3,3'-dihydroxybiphenyl, N,N'-(4-aminophenylcarbonyl)2,2'-bis(3-amino-4-hydroxyphenyl) hexafluoropropane, N,N'-(3-aminophenylcarbonyl)2,2'-bis (3-amino-4-hydroxyphenyl)hexafluoropropane, N,N'-(4-aminophenylcarbonyl)2,2'-bis(3-amino-4-hydroxyphenyl) propane, N,N'-(3-aminophenylcarbonyl)2,2'-bis(3-amino-4-hydroxyphenyl)propane, N,N'-(4-aminophenylcarbonyl)-oxybis(3-amino-4-hydroxyphenyl), N,N'-(3-aminophenylcarbonyl)-oxybis(3-amino-4-hydroxyphenyl), N,N'-(4-aminophenylcarbonyl)-bis(3-amino-4-hydroxyphenyl)sulfone, N,N'-(3-aminophenylcarbonyl)-bis(3-amino-4-hydroxyphenyl)sulfone, N,N'-(4-aminophenylcarbonyl)-2,4-diaminophenol, N,N'-(3-aminophenylcarbonyl)-2,4-diaminophenol, N,N'-(4-aminophenylcarbonyl)-1,4-diamino-2,5-dihydroxybenzene, and N,N'-(3-aminophenylcarbonyl)-1,4-diamino-2,5-dihydroxybenzene, and these may be used individually or in combination. The diamine is not necessarily limited to those listed above.

As mentioned above, a tetracarboxylic dianhydride is reacted with a diamine to obtain a polyamide acid as a polyimide precursor, and the introduction of the functional group $R_1$ in the general formula (1) enables control of the solubility during the development and/or patterning using a photoreaction.

When imparting negative photosensitivity to a resin composition, it is preferred that the functional group contains a reactive functional group, such as a vinyl group, an allyl group, an acryloyl group, or a methacryloyl group from the viewpoint of obtaining an excellent pattern form after the development.

As examples of the reactive functional groups, there can be mentioned functional groups having a carbon-carbon unsaturated double bond. Examples of functional groups having a carbon-carbon unsaturated double bond may include allyl alcohol, 2-methyl-2-propen-1-ol, crotyl alcohol, 3-buten-1-ol, 3-buten-2-ol, 3-methyl-2-bute-1-ol, 2-methyl-3-buten-1-ol, 3-methyl-3-buten-1-ol, 2-methyl-3-buten-2-ol, 2-penten-1-ol, 4-penten-1-ol, 3-penten-2-ol, 4-penten-2-ol, 1-penten-3-ol, 4-methyl-3-penten-1-ol, 3-methyl-1-penten-3-ol, 2-hexen-1-ol, 3-hexen-1-ol, 4-hexen-1-ol, 5-hexen-1-ol, 1-hexen-3-ol, 1-heptan-3-ol, 6-methyl-5-heptan-2-ol, 1-octan-3-ol, citronellol, 3-nonen-1-ol, 5-decan-1-ol, 9-decan-1-ol, 7-decan-1-ol, 1,4-pentadien-3-ol, 2,4-hexadien-1-ol, 1,5-hexadien-3-ol, 1,6-heptadien-4-ol, 2,4-dimethyl-2,6-heptadien-1-ol, nerol, geraniol, linalool, 2-cyclohexen-1-ol, 3-cyclohexen-1-methanol, isopulegol, 5-norbornen-2-ol, 5-norbornen-2-methanol, ethylene glycol vinyl ether, 1,4-butanediol vinyl ether, 1,6-hexanediol vinyl ether, diethylene glycol vinyl ether, 2-hydroxyethyl acrylate, 3-hydroxypropyl acrylate, 2-hydroxyethyl methacrylate, 3-hydroxypropyl methacrylate, 4-hydroxybutyl acrylate, 4-hydroxybutyl methacrylate, pentaerythritol diacrylate monostearate, pentaerythritol triacrylate, caprolactone 2-(methacryloyloxy) ethyl ester, dicaprolactone 2-(methacryloyloxy)ethyl ester, 2-hydroxy-3-phenoxypropyl acrylate, and 2-hydroxy-3-phenoxypropyl methacrylate. The functional group having a carbon-carbon unsaturated double bond is not necessarily limited to those listed above. The functional group may be partially introduced to impart alkali solubility to the polymer. When the polymer has an acid functional group at its end, the functional group can be introduced.

When imparting positive photosensitivity to a resin composition, a substituent may be introduced to control the solubility or utilize an elimination reaction. Examples of such substituents may include methyl, ethyl, propyl, isopropyl, n-butyl, s-butyl, t-butyl, cyclopropenyl, cyclobutyl, cyclopentyl, cyclohexyl, cyclohexylmethyl, cyclohexenyl, norbornyl, norbornenyl, adamantyl, benzyl, p-nitrobenzyl, trifluoromethyl, methoxyethyl, ethoxyethyl, methoxymethyl, ethoxymethyl, methoxyethoxymethyl, benzoxymethyl, ethoxytetrahydropyranyl, tetrahydrofuranyl, 2-trimethylsilylethoxymethyl, trimethylsilyl, t-butyldimethylsilyl, 3-oxocyclohexyl, 9-fluorenylmethyl, and methylthiomethyl. The substituent is not necessarily limited to those listed above. The functional group may be partially introduced to control the alkali solubility. When the polymer has an acid functional group at its end, the functional group can be introduced.

Examples of dicarboxylic acids may include 3-fluoroisophthalic acid, 2-fluoroisophthalic acid, 3-fluorophthalic acid, 2-fluorophthalic acid, 2,4,5,6-tetrafluoroisophthalic acid, 3,4,5,6-tetrafluorophthalic acid, 4,4'-hexafluoroisopropylidenediphenyl-1,1'-butyldimethylsilyl, dicarboxylic acid, perfluorosuberic acid, 2,2'-bis(trifluoromethyl)-4,4'-biphenylenedicarboxylic acid, terephthalic acid, isophthalic acid, and 4,4'-oxydiphenyl-1,1'-dicarboxylic acid, and these may be used individually or in combination. The dicarboxylic acid is not necessarily limited to those listed above.

Examples of bisaminophenols may include 2,2'-dihydroxy-4,4'-diaminobiphenyl, 3,3'-dihydroxy-4,4'-diaminobiphenyl, 4,4'-diamino-3,3'-dihydroxybiphenyl, 2,2'-bis(3-amino-4-hydroxyphenyl)propane, 2,2'-bis(3-amino-4-hydroxyphenyl)hexafluoropropane, oxybis(3-amino-4-hydroxyphenyl), bis(3-amino-4-hydroxyphenyl)sulfone, 2,4-diaminophenol, 1,4-diamino-2,5-dihydroxybenzene, N,N'-(4-aminophenylcarbonyl)-3,3'-dihydroxybiphenyl, N,N'-(3-aminophenylcarbonyl)-3,3'-dihydroxybiphenyl, N,N'-(4-aminophenylcarbonyl)2,2'-bis(3-amino-4-hydroxyphenyl)hexafluoropropane, N,N'-(3-aminophenylcarbonyl) 2,2'-bis(3-amino-4-hydroxyphenyl)hexafluoropropane, N,N'-(4-aminophenylcarbonyl)2,2'-bis(3-amino-4-hydroxyphenyl)propane, N,N'-(3-aminophenylcarbonyl)2,2'-bis(3-amino-4-hydroxyphenyl)propane, N,N'-(4-aminophenylcarbonyl)-oxybis(3-amino-4-hydroxyphenyl), N,N'-(3-aminophenylcarbonyl)-oxybis(3-amino-4-hydroxyphenyl), N,N'-(4-aminophenylcarbonyl)-bis(3-amino-4-hydroxyphenyl)sulfone, N,N'-(3-aminophenylcarbonyl)-bis(3-amino-4-hydroxyphenyl)sulfone, N,N'-(4-aminophenylcarbonyl)-2,4-diaminophenol, N,N'-(3-aminophenylcarbonyl)-2,4-diaminophenol, N,N'-(4-aminophenylcarbonyl)-1,4-diamino-2,5-dihydroxybenzene, and N,N'-(3-aminophenylcarbonyl)-1,4-diamino-2,5-dihydroxybenzene, and these may be used individually or in combination. The bisaminophenol is not necessarily limited to those listed above. The bisaminophenol and the above diamine may be used in combination.

Like in the polyamide acid as the polyimide precursor, in the polybenzoxazole precursor, the introduction of a functional group similar to $R_1$ in the general formula (1) into $R_2$ in the general formula (2) enables control of the solubility during the development and/or patterning using a photoreaction. The functional group may be partially introduced to control the alkali solubility. When the polymer has an acid functional group at its end, the functional group can be introduced.

More generally, the tetracarboxylic dianhydride is represented by the following general formula (3).

(3)

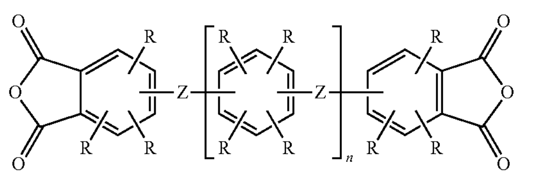

More generally, the diamine is represented by the following general formula (4).

(4)

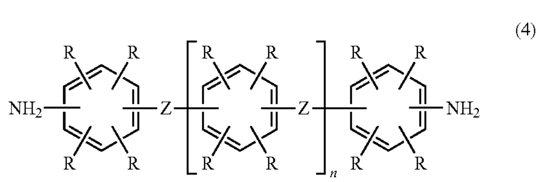

More generally, the dicarboxylic acid is represented by the following general formula (5).

(5)

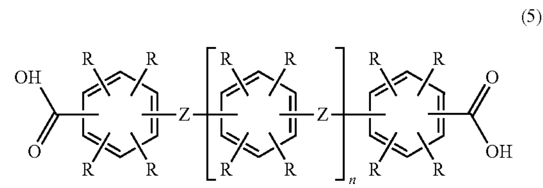

More generally, the bisaminophenol is represented by the following general formula (6).

(6)

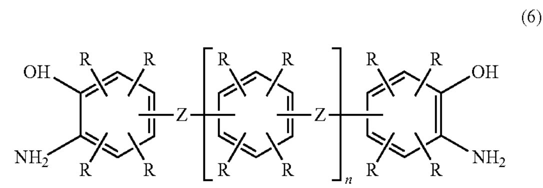

In the general formulae (3) to (6), n is 0 or a natural number, and characters R and Z are a monovalent organic group and a divalent organic group, respectively, and represented by the following formulae.

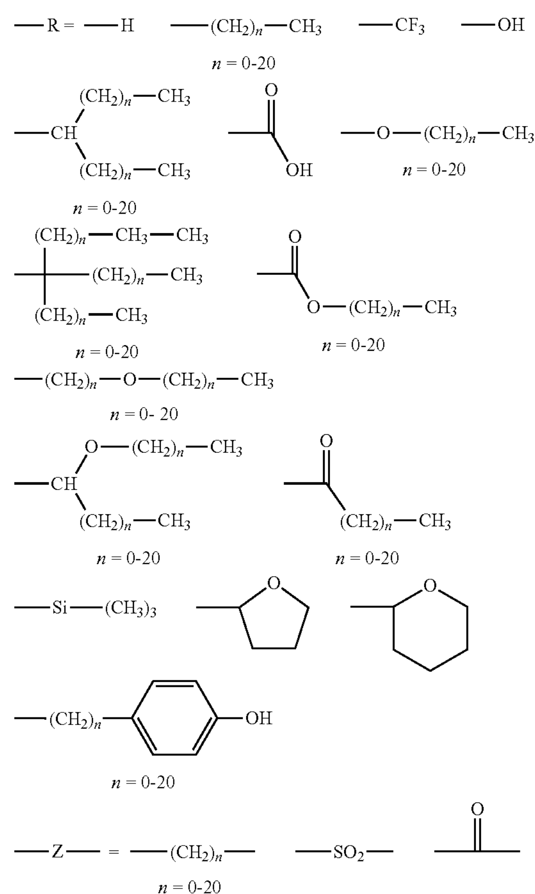

-continued

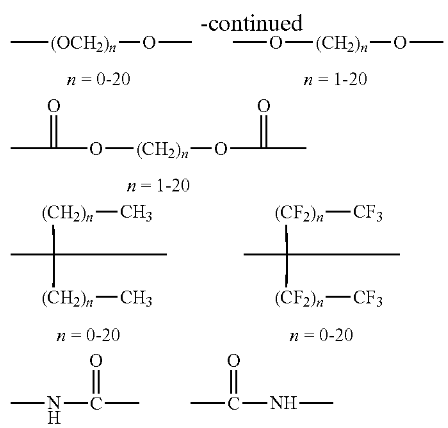

It is preferred that polymer (A) has at its end at least one substituent derived from an amine functional group and/or at least one acid functional group and/or substituent derived therefrom from the viewpoint of forming a cured resin having further more excellent properties. When the amine functional group is a primary amine, the stability of the photosensitive resin composition is lowered due to a side reaction, and therefore it is preferred that at least one of the two hydrogen atoms on the amine functional group is replaced by another atom or another functional group from the viewpoint of obtaining the photosensitive resin composition having satisfactory stability.

Examples of the substituents on nitrogen derived from an amine functional group may include carbonyl, carbamate, amide, sulfonyl, sulfenyl, phosphinyl, and alkylsilyl. Of these, preferred are carbonyl, carbamate, and sulfonyl from the viewpoint of obtaining a cured resin having more excellent properties.

The substituent is hydrogen or any of those represented by the following general formulae (7) to (9):

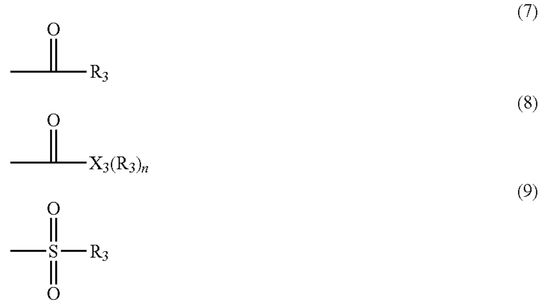

wherein $R_3$ represents a monovalent organic group, preferably having 1 to 20 carbon atoms; $X_3$ represents an oxygen, sulfur, or nitrogen atom; and n represents 1 when $X_3$ is an oxygen atom or a sulfur atom, or n represents 2 when $X_3$ is a nitrogen atom.

Examples of $R_3$'s may include methyl, ethyl, propyl, isopropyl, n-butyl, s-butyl, t-butyl, cyclopropenyl, cyclobutyl, cyclopentyl, cyclohexyl, cyclohexylmethyl, cyclohexenyl, norbornyl, norbornenyl, adamantyl, benzyl, p-nitrobenzyl, trifluoromethyl, methoxyethyl, ethoxyethyl, methoxymethyl, ethoxymethyl, methoxyethoxymethyl, benzoxymethyl, ethoxytetrahydropyranyl, tetrahydrofuranyl, 2-trimethylsilylethoxymethyl, trimethylsilyl, t-butyldimethylsilyl, 3-oxocyclohexyl, 9-fluorenylmethyl, methylthiomethyl, phenyl, toluyl, xylyl, 9,10-dihydroanthranyl, trimethylphenyl, pentamethylphenyl, biphenyl, terphenyl, quaterphenyl, dimethylbiphenyl, naphthalenyl, methylnaphthalenyl, fluorenyl, fluorophenyl, fluorobiphenyl, isopropylidenebiphenyl, tetrafluoroisopropylidenebiphenyl, benzyl phenyl ether, phenyl ether, phenoxytoluoyl, methoxybiphenyl, dimethoxybiphenyl, methoxynaphthalenyl, dimethoxynaphthalenyl, and nitrophenyl. $R_3$ is not necessarily limited to those listed above.

As the acid functional group and/or substituent derived therefrom, one represented by $R_1$ in the general formula (1) or $R_2$ in the general formula (2) may be used.

In the present invention, basically it is preferred that compound (B) is a compound having at least one substituent derived from an amine functional group. When the amine functional group is a primary amine, the stability of the photosensitive resin composition may be lowered due to a side reaction. Therefore at least one of the two hydrogen atoms on the primary amine functional group is to be replaced by another atom or another functional group.

More generally, the compound is represented by the following general formula (10):

$$X_4\text{—}(NR_4R_5)_n \qquad (10)$$

wherein $X_4$ represents an n-valent organic group, each of $R_4$ and $R_5$ represents hydrogen or a monovalent organic group, and n represents an integer of 2 to 6.

Examples of $X_4$'s may include aliphatic groups, such as an alkyl chain, a cyclopentyl ring, a cyclohexyl ring, a cyclooctyl ring, and a bicyclo ring, and these may contain a hetero atom, such as oxygen or sulfur.

Further, examples of $X_4$'s may include aromatic groups, such as a benzene ring and a naphthalene ring. Of these, preferred are aromatic groups from the viewpoint of achieving excellent heat resistance. Examples of aromatic groups may include benzene, toluene, cumene, diphenylmethane, xylene, 9,10-dihydroanthracene, mesitylene, hexamethylbenzene, biphenyl, terphenyl, triphenylbenzene, quaterphenyl, dimethylbiphenyl, azulene, naphthalene, methylnaphthalene, anthracene, fluorene, fluorobenzene, fluorobiphenyl, anisole, benzyl phenyl ether, phenyl ether, phenoxytoluene, tolyl ether, methoxybiphenyl, dimethoxybiphenyl, methoxynaphthalene, dimethoxynaphthalene, nitrobenzene, acetophenone, benzophenone, benzanilide, phenyl sulfone, furan, and thiophene. $X_4$ is not necessarily limited to those listed above.

Each of $R_4$ and $R_5$ in general formula (10) is generally hydrogen or any of those represented by the general formula (11) below. Examples of $R_4$'s or $R_5$'s may include carbonyl, carbamate, amide, sulfonyl, sulfenyl, phosphinyl, and alkylsilyl. Of these, preferred are carbonyl, carbamate, and sulfonyl from the viewpoint of obtaining a cured resin having more excellent properties. As the substituent, hydrogen or one represented by the general formulae (7) to (9) may be used.

$$\begin{array}{l}(OR_6)l \\ \;| \\ X_4\text{—}(NR_4R_5)_n \\ \;| \\ (COOR_7)_m\end{array} \qquad (11)$$

wherein $X_4$ represents an (m+n+l)-valent organic group; each of $R_4$, $R_5$, $R_6$, and $R_7$ represents hydrogen or a monovalent organic group; n represents 1 to 6; and each of l and m represents 1 to 4, wherein each of $R_6$ and $R_7$ is a monovalent organic group and a functional group similar to $R_1$ or $R_2$ above may be introduced.

Structures of more preferred compounds of the general formula (10) are shown below.
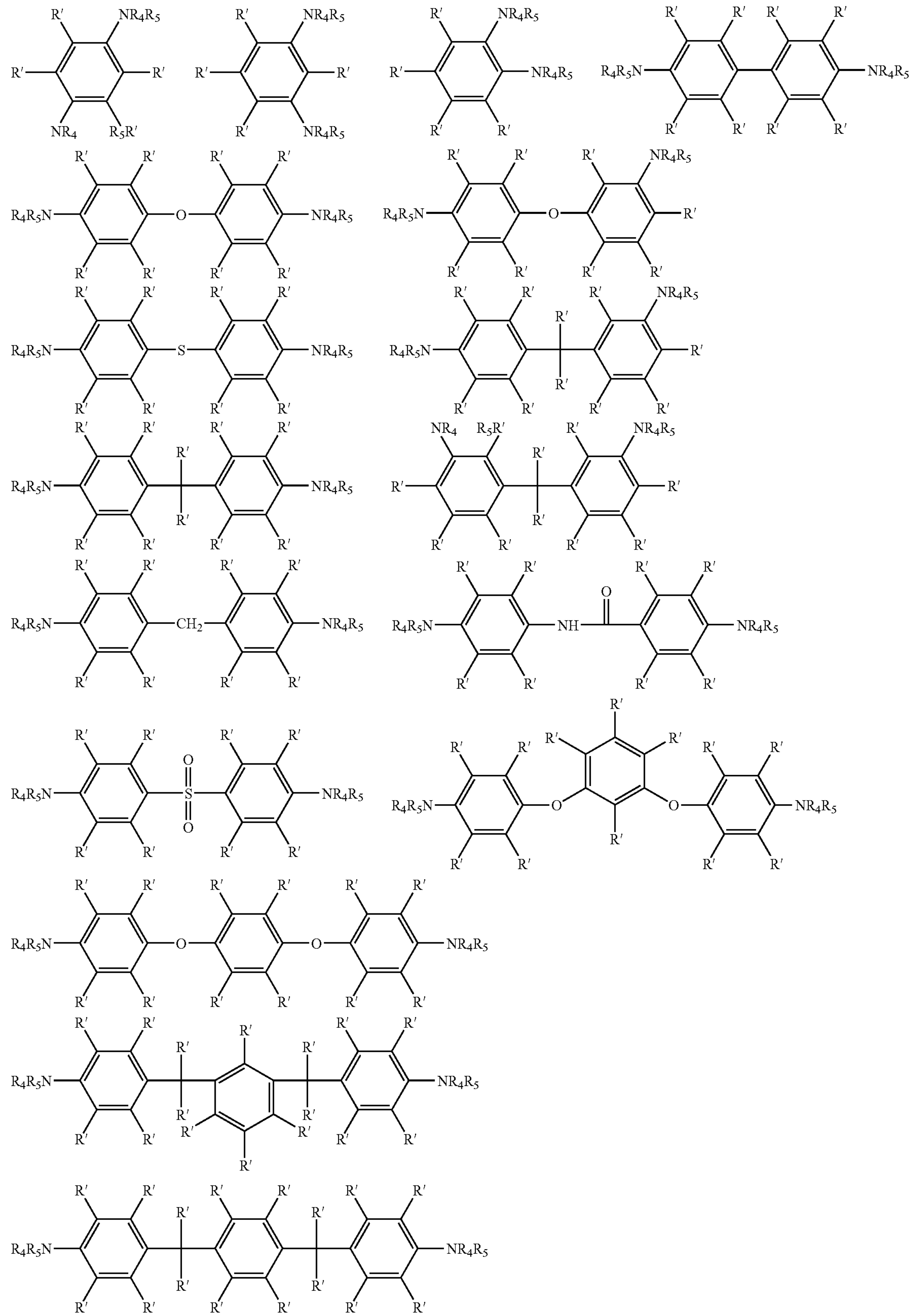

-continued

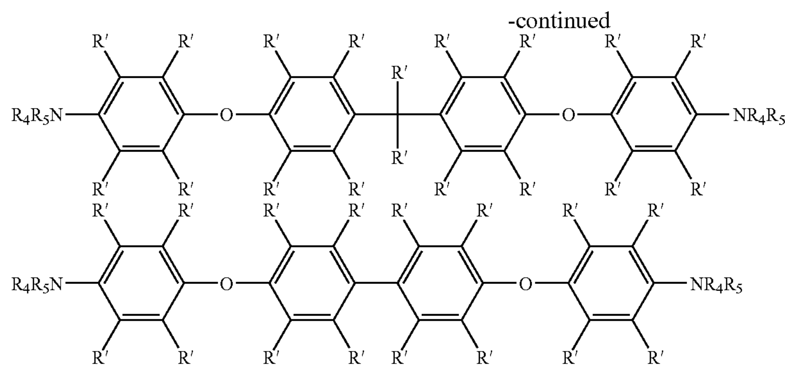

In the aforementioned formulae, R' represents hydrogen or a monovalent organic group, and examples of R's may include $R_3$ in the general formulae (7) to (9), an ether group, an ester group, and a halogen, such as fluorine.

The compound represented by the general formula (10) may be a compound having at least one substituent derived from an amine functional group and further having at least one acid functional group and/or substituent derived therefrom. The acid functional group is more preferably a carboxylic acid group and/or a phenolic hydroxyl group. Specifically, the compound is represented by the following general formula (11):

$$\begin{matrix}(OR_6)_l \\ | \\ X_4 - (NR_4R_5)_n \\ | \\ (COOR_7)_m\end{matrix} \tag{11}$$

wherein $X_4$ represents an (m+n+l)-valent organic group; each of $R_4$, $R_5$, $R_6$, and $R_7$ represents hydrogen or a monovalent organic group; n represents 1 to 6; and each of l and m represents 1 to 4, wherein each of $R_6$ and $R_7$ is a monovalent organic group and a functional group similar to $R_1$ or $R_2$ above may be introduced.

Examples of $X_4$'s may include aliphatic groups, such as an alkyl chain, a cyclopentyl ring, a cyclohexyl ring, a cyclooctyl ring, and a bicyclo ring, and these may contain a hetero atom, such as oxygen or sulfur.

Further, examples of $X_4$'s may also include aromatic groups, such as a benzene ring and a naphthalene ring. Of these, preferred are aromatic groups from the viewpoint of achieving excellent heat resistance.

Examples of aromatic groups may include benzene, toluene, cumene, diphenylmethane, xylene, 9,10-dihydroanthracene, mesitylene, hexamethylbenzene, biphenyl, terphenyl, triphenylbenzene, quaterphenyl, dimethylbiphenyl, azulene, naphthalene, methylnaphthalene, anthracene, fluorene, fluorobenzene, fluorobiphenyl, anisole, benzyl phenyl ether, phenyl ether, phenoxytoluene, tolyl ether, methoxybiphenyl, dimethoxybiphenyl, methoxynaphthalene, dimethoxynaphthalene, nitrobenzene, acetophenone, benzophenone, benzanilide, phenyl sulfone, furan, and thiophene. $X_4$ is not necessarily limited to those listed above.

Each of $R_4$ and $R_5$ in the general formula (11) is generally hydrogen or any of those represented by the general formulae (7) to (9). Examples of $R_4$'s or $R_5$'s may include carbonyl, carbamate, amide, sulfonyl, sulfenyl, phosphinyl, and alkylsilyl. Of these, preferred are carbonyl, carbamate, and sulfonyl from the viewpoint of obtaining a cured resin having more excellent properties. As the substituent, hydrogen or one represented by the general formulae (7) to (9) may be used.

Structures of more preferred compounds of the general formula (11) are shown below.

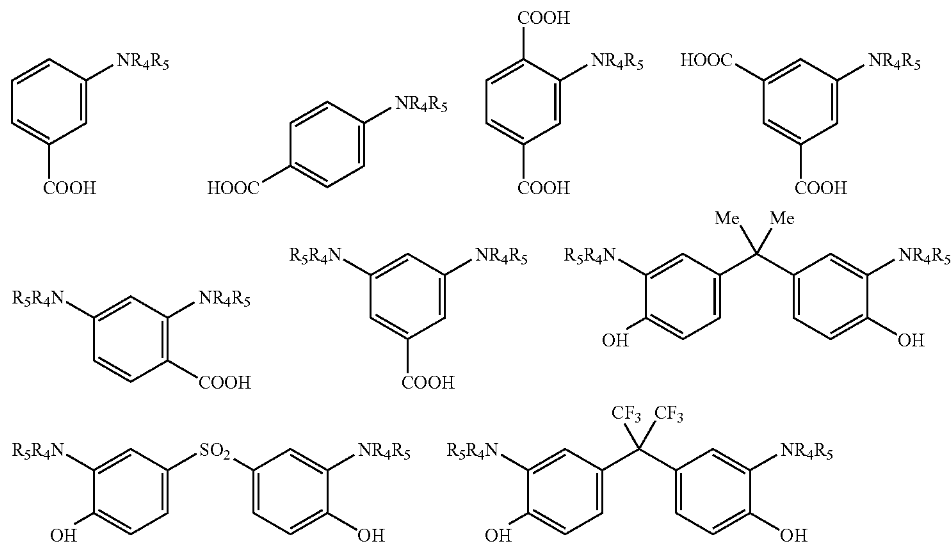

-continued
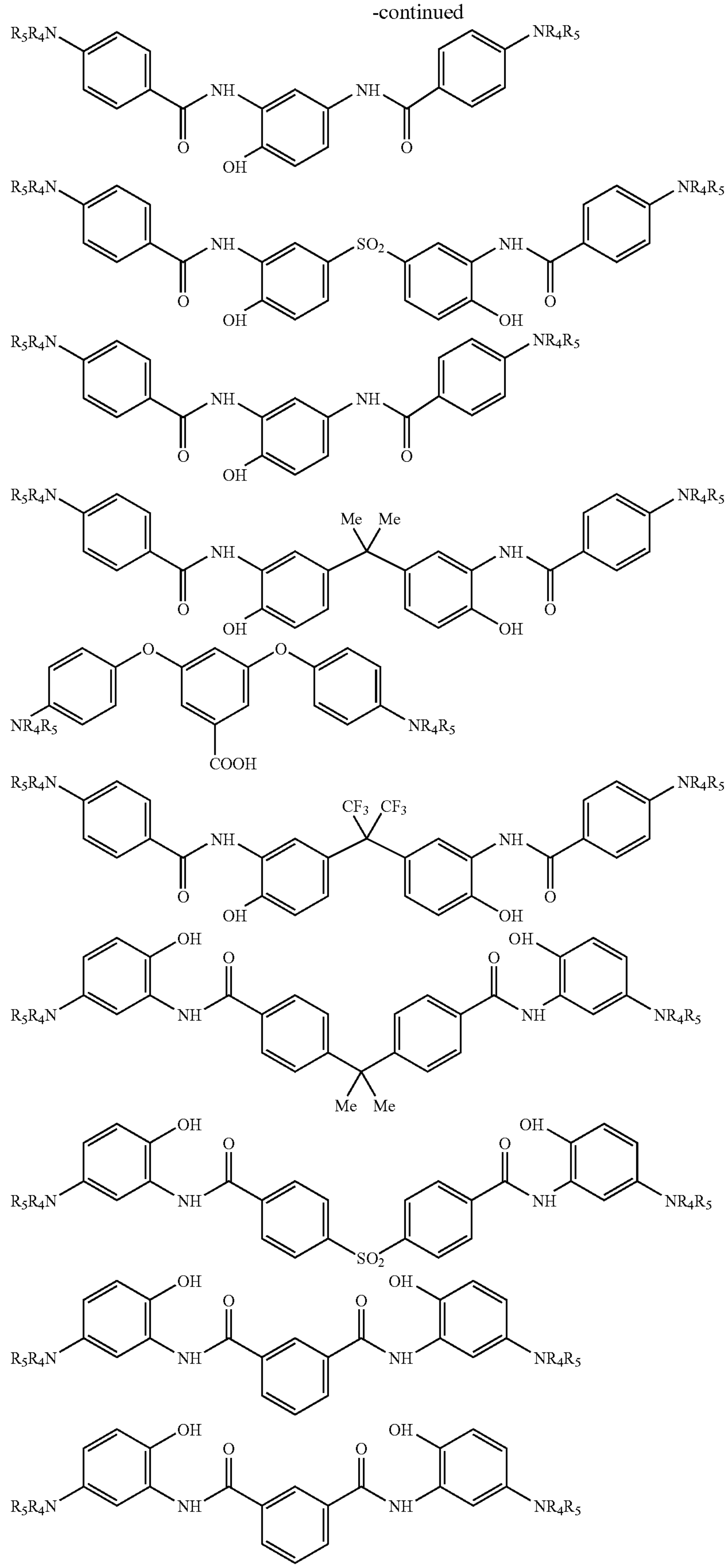

-continued

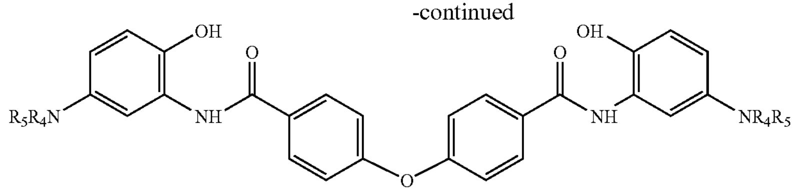

Hydrogen on the aromatic ring may be replaced by a monovalent organic group, such as $R_3$ in the general formulae (7) to (9), or a halogen, such as fluorine.

It is considered that compound (B) serves as a chain extender capable of increasing the molecular weight of polymer (A) during the heat curing. Therefore, the compound is preferably incorporated in an amount in the range of from 0.05 to 50 parts by weight, more preferably 0.2 to 20 parts by weight, relative to 100 parts by weight of polymer component (A).

Photoreactive compound (C) used in the present invention is a sensitizer, and, when the compound is a negative sensitizer, it has photopolymerizability and reduces the solubility of the exposed portion.

Examples of the sensitizers may include benzophenones, such as benzophenone, Michler's ketone, 4,4,-bis(diethylamino)benzophenone, and 3,3,4,4,-tetra(t-butylperoxycarbonyl)benzophenone; benzylidenes, such as 3,5-bis(diethylaminobenzylidene)-N-methyl-4-piperidone and 3,5-bis (diethylaminobenzylidene)-N-ethyl-4-piperidone; coumarins, such as 7-diethylamino-3-thenoylcoumarin, 4,6-dimethyl-3-ethylaminocoumarin, 3,3,-carbonylbis(7-diethylaminocoumarin), 7-diethylamino-3-(1-methylbenzimidazolyl)coumarin, and 3-(2-benzothiazolyl)-7-diethylaminocoumarin; anthraquinones, such as 2-t-butylanthraquinone, 2-ethylanthraquinone, and 1,2-benzanthraquinone; benzoins, such as benzoin methyl ether, benzoin ethyl ether, and benzoin isopropyl ether; thioxanthones, such as 2,4-dimethylthioxanthone, 2,4-diethylthioxanthone, 2,4-diisopropylthioxanthone, and 2-isopropylthioxanthone; mercapto compounds, such as ethylene glycol di(3-mercaptopropionate), 2-mercaptobenzothiazole, 2-mercaptobenzoxazole, and 2-mercaptobenzimidazole; glycines, such as N-phenylglycine, N-methyl-N-phenylglycine, N-ethyl-N-(p-chlorophenyl)glycine, and N-(4-cyanophenyl) glycine; oximes, such as 1-phenyl-1,2-butanedione-2-(o-methoxycarbonyl)oxime, 1-phenyl-1,2-propanedione-2-(o-methoxycarbonyl)oxime, 1-phenyl-1,2-propanedione-2-(o-ethoxycarbonyl)oxime, and 1-phenyl-1,2-propanedione-2-(o-benzoyl)oxime; and 2,2'-bis(o-chlorophenyl)-4,4',5,5'-tetraphenylbiimidazole. These may be used individually or in combination. The sensitizer is not necessarily limited to those listed above.

These sensitizers may be used individually or in combination. The amount of the sensitizer used is generally in the range of from 0.01 to 15% by weight, or the total amount of the two or more sensitizers used is preferably in the range of from 0.1 to 40% by weight, more preferably 1 to 20 parts by weight, relative to 100 parts by weight of polymer component (A).

A positive sensitizer generates acid and increases the solubility of the exposed portion in an alkaline aqueous solution. Examples of positive sensitizers may include o-quinonediazide compounds, aryldiazonium salts, diaryliodonium salts, and triarylsulfonium salts. The positive sensitizer is not limited to the compounds listed above, and any compound that generates acid as a response to light exposure may be used.

The o-quinonediazide compound may be obtained by subjecting, for example, o-quinonediazidosulfonyl chloride, a hydroxy compound, and an amino compound or the like to condensation reaction in the presence of a dehydrochlorination agent. Examples of the o-quinonediazidosulfonyl chlorides may include benzoquinone-1,2-diazido-4-sulfonyl chloride, naphthoquinone-1,2-diazido-5-sulfonyl chloride, and naphthoquinone-1,2-diazido-4-sulfonyl chloride. The o-quinonediazidosulfonyl chloride is not necessarily limited to those listed above.

As the hydroxy compound, for example, hydroquinone, resorcinol, pyrogallol, bisphenol A, bis(4-hydroxyphenyl) methane, 2,2'-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl) methane, bis(2,3,4-trihydroxyphenyl)propane, 4b,5,9b,10-tetrahydro-1,3,6,8-tetrahydroxy-5,10-dimethylindeno[2,1-a]indene, tris(4-hydroxyphenyl)methane, or tris(4-hydroxyphenyl)ethane may be used. The hydroxy compound is not necessarily limited to those listed above.

Examples of the aryldiazonium salts, diaryliodonium salts, or triarylsulfonium salts may include benzenediazonium p-toluenesulfonate, diphenyliodonium 9,10-dimethoxyanthracene-2-sulfonate, tris(4-t-butylphenyl)sulfonium trifluoromethanesulfonate, N-naphthalimide trifluoromethanesulfonate, p-nitrobenzyl 9,10-dimethoxyanthracene-2-sulfonate, 4-methoxy-α-({[(4-methylphenyl)sulfonyl] oxy}imino)benzeneacetonitrile, and 2-(2'-furylethenyl)-4,6-bis(trichloromethyl)-1,3,5-triazine. The salt is not necessarily limited to those listed above.

These sensitizers may be used individually or in combination. The amount of the sensitizer used is generally in the range of from 0.1 to 40% by weight, or the total amount of the two or more sensitizers used is preferably in the range of from 0.1 to 40% by weight, more preferably 1 to 20 parts by weight, relative to 100 parts by weight of polymer component (A).

As solvent (D) in the present invention, preferred is a polar solvent, such as γ-butyrolactone, N-methyl-2-pyrrolidone, N-acetyl-2-pyrrolidone, N,N-dimethylacetamide, N,N-dimethyl sulfoxide, hexamethylphosphoric triamide, dimethylimidazolidinone, or N-acetyl-∈-caprolactam. Other than the polar solvent, ketone, ester, lactone, ether, halogenated hydrocarbon, or hydrocarbon, for example, acetone, diethyl ketone, methyl ethyl ketone, methyl isobutyl ketone, cyclohexanone, methyl acetate, ethyl acetate, butyl acetate, diethyl oxalate, diethyl malonate, diethyl ether, ethylene glycol dimethyl ether, diethylene glycol dimethyl ether, tetrahydrofuran, dichloromethane, 1,2-dichloroethane, 1,4-dichlorobutane, trichloroethane, chlorobenzene, o-dichlorobenzene, hexane, heptane, octane, benzene, toluene, or xylene may also be used. These organic solvents may be used individually or in combination. With respect to the type of the solvent, there is no particular limitation as long as the solvent dissolves the photosensitive resin composition of the present invention.

In addition to the essential components, the photosensitive resin composition of the present invention may also contain a silane coupling agent as an agent for improving the adhesion to a silicon substrate. $R_2$ in the formula (1) of the base polymer may be modified with diaminosiloxane. If desired, an addition-polymerizable compound, a dissolution inhibitor, a dissolution promoter, and a stabilizer may be incorporated.

A negative addition-polymerizable compound contains a reactive unsaturated functional group. Examples of the functional groups may include functional groups having an unsaturated double bond, such as a vinyl group, an allyl group, an acryloyl group, and a methacryloyl group, and functional groups having an unsaturated triple bond, such as propargyl group. Of these, preferred are functional groups of a conjugated type, such as a vinyl group, an acryloyl group, and a methacryloyl group, from the viewpoint of achieving excellent reactivity. The number of the functional group or groups contained is preferably 1 to 4 from the viewpoint of obtaining excellent stability, and the functional groups contained may be either the same or different.

Examples of the addition-polymerizable compounds may include diethylene glycol diacrylate, triethylene glycol diacrylate, tetraethylene glycol diacrylate, diethylene glycol dimethacrylate, triethylene glycol dimethacrylate, tetraethylene glycol dimethacrylate, trimethylolpropane diacrylate, trimethylolpropane triacrylate, trimethylolpropane dimethacrylate, trimethylolpropane trimethacrylate, styrene, α-methylstyrene, 1,2-dihydronaphthalene, 1,3-diisopropenylbenzene, 3-methylstyrene, 4-methylstyrene, 2-vinylnaphthalene, butyl acrylate, butyl methacrylate, isobutyl acrylate, hexyl acrylate, isooctyl acrylate, isobornyl acrylate, cyclohexyl methacrylate, 1,3-butanediol diacrylate, 1,3-butanediol dimethacrylate, neopentyl glycol diacrylate, 1,4-butanediol diacrylate, 1,4-butanediol dimethacrylate, 1,6-hexanediol diacrylate, 1,6-hexanediol methacrylate, 1,9-nonanediol dimethacrylate, 1,10-decanediol dimethacrylate, dimethylol-tricyclodecane diacrylate, pentaerythritol triacrylate, pentaerythritol tetraacrylate, pentaerythritol trimethacrylate, pentaerythritol tetramethacrylate, 2-hydroxyethyl acrylate, 2-hydroxyethyl methacrylate, 1,3-acryloyloxy-2-hydroxypropane, 1,3-methacryloyloxy-2-hydroxypropane, methylenebisacrylamide, N,N-dimethylacrylamide, and N-methylolacrylamide. These may be used individually or in combination.

The amount of the addition-polymerizable compound used is preferably 5 to 100% by weight, based on the weight of component (A), and is more preferably 5 to 40% by weight from the viewpoint of achieving excellent compatibility. When the amount of the addition-polymerizable compound used is less than 5% by weight, the exposed portion tends to dissolve during the development and the film tends to be washed away after the development. When the amount is more than 100% by weight, the film tends to be washed away after the development, and the film being formed may be suffer whitening.

For improving the storage stability, a radical polymerization inhibitor or radical polymerization retarder may be added to the composition. Examples of the radical polymerization inhibitors or radical polymerization retarders may include p-methoxyphenol, diphenyl-p-benzoquinone, benzoquinone, hydroquinone, pyrogallol, phenothiazine, resorcinol, orthodinitrobenzene, paradinitrobenzene, metadinitrobenzene, phenanthraquinone, N-phenyl-1-naphthylamine, N-phenyl-2-naphthylamine, cupferron, phenothiazine, 2,5-toluquinone, tannic acid, parabenzylaminophenol, and nitrosoamine. These may be used individually or in combination. The amount of the radical polymerization inhibitor or radical polymerization retarder used is generally 0.01 to 30% by weight, based on the weight of component (A).

The photosensitive resin composition of the present invention may be applied to a substrate, such as a silicon wafer, a metallic substrate, or a ceramic substrate, by a dipping process, a spraying process, a screen printing process, or a spin coating process, and dried by appropriately heating for removing the solvent, to thereby form a tack-free film. This film is exposed to active rays of light or actinic radiation through a mask having a desired pattern. As the active rays of light or actinic radiation for exposure, a contact/proximity aligner, mirror projection aligner, i-line stepper, or g-line stepper using an ultra high-pressure mercury lamp, ultraviolet light, a visible light source, an X-ray, or an electron beam may be used. Subsequently, if necessary, the resultant film is subjected to post exposure bake (PEB) treatment, followed by development. When the photosensitive resin composition is negative, after the exposure, the unexposed portion may be removed by dissolving it in a developer to obtain a desired negative pattern. When the photosensitive resin composition is positive, after the exposure, the exposed portion may be removed by dissolving it in a developer to obtain a desired positive pattern.

As the developer, an organic solvent or an alkaline aqueous solution may be used. Examples of the organic solvent developer may include N-methyl-2-pyrrolidone, N,N-dimethylacetamide, N,N-dimethylformamide, dimethyl sulfoxide, tetramethylurea, hexamethylphosphoric triamide, γ-butyrolactone, water, alcohol, ketone, ester, lactone, ether, halogenated hydrocarbon, and hydrocarbon. Further examples of the organic solvent may include methanol, ethanol, isopropyl alcohol, acetone, diethyl ketone, methyl ethyl ketone, methyl isobutyl ketone, cyclohexanone, methyl acetate, ethyl acetate, butyl acetate, diethyl oxalate, diethyl malonate, diethyl ether, ethylene glycol dimethyl ether, diethylene glycol dimethyl ether, tetrahydrofuran, dichloromethane, 1,2-dichloroethane, 1,4-dichlorobutane, trichloroethane, chlorobenzene, o-dichlorobenzene, hexane, heptane, octane, benzene, toluene, and xylene. These may be used individually or in combination.

As the alkaline aqueous solution, there may be used an aqueous solution of an alkaline metal hydroxide, such as caustic potash or caustic soda, quaternary ammonium hydroxide, such as tetramethylammonium hydroxide, tetraethylammonium hydroxide, or choline, or an aqueous solution of an amine, such as ethanolamine, propylamine, or ethylenediamine. After the development, if necessary, rinsing with water or a poor solvent is performed. As the rinsing liquid, for example, methanol, ethanol, isopropyl alcohol, benzene, toluene, xylene, methyl cellosolve, or water is used. The thus obtained pattern is heated to remove the sensitizer and solvent to give a stable, high heat-resistant polyimide pattern.

The heating temperature is preferably 150 to 500° C., more preferably 200 to 400° C. When the heating temperature is lower than 150° C., the resultant film is likely to have poor mechanical properties and poor thermal properties, and, when the heating temperature is higher than 500° C., the resultant film is likely to have poor mechanical properties and poor thermal properties.

The heating time is preferably 0.05 to 10 hours. When the heating time is shorter than 0.05 hour, the resultant film is likely to have poor mechanical properties and poor thermal properties, and, when the heating time is longer than 10 hours, the resultant film is likely to have poor mechanical properties and poor thermal properties.

The photosensitive resin composition of the present invention may be used in an electronic part for semiconductor device or multilayer wiring board. Specifically, the present photosensitive resin composition may be used in forming a surface protecting film layer or interlayer dielectric layer for semiconductor device, or an interlayer dielectric layer for multilayer wiring board. The semiconductor device directed to the present invention is not particularly limited as long as it has a surface protecting film layer or interlayer dielectric layer formed of the composition of the present invention, and it may be of various structures.

An example of the process for fabricating a semiconductor device as one example of the electronic part of the present invention is described below.

FIG. 1 is a manufacturing process diagram of a semiconductor device of a multilayer wiring structure. In FIG. 1, a semiconductor substrate 1, such as an Si substrate, having a circuit element is covered with a protecting film 2, such as a silicon oxide film, excluding the circuit element at a predetermined portion. On the exposed circuit element, there is formed a first conductive layer 3. An interlayer dielectric layer 4 is formed on the semiconductor substrate by, e.g., a spin coating process (step (a)).

A photosensitive resin layer 5 made of, e.g., chlorinated rubber or phenolic novolak is then formed on the interlayer dielectric layer 4 by a spin coating process, and windows 6A are formed by a known photolithography technique so that predetermined portions of the interlayer dielectric layer 4 are exposed (step (b)).

The interlayer dielectric layer 4 exposed through the windows 6A is selectively etched by a dry etching method using gas, such as oxygen gas or carbon tetrafluoride gas, to form windows 6B. The photosensitive resin layer 5 is then completely removed using such an etching solution that only the photosensitive resin layer 5 is etched without etching the first conductive layer 3 exposed through the windows 6B (step (c)).

A second conductive layer 7 is formed further using a known photolithography technique to complete electrical connection to the first conductive layer 3 (step (d)). When a multilayer wiring structure having three layers or more is formed, a series of the aforementioned steps is repeated to form layers.

Next, a surface protecting film layer 8 is formed. In the example of FIG. 1, the surface protecting film layer 8 is formed by applying the photosensitive resin composition by a spin coating process and drying it, and exposing the resultant layer to light through a mask having a pattern for forming windows 6C at predetermined portions, and then developing it using an alkaline aqueous solution to form a pattern, and heating the layer to obtain a resin film. This resin film protects the conductive layer from an external stress or α-line, and therefore the semiconductor device obtained has excellent reliability. In the aforementioned example, the interlayer dielectric layer 4 may also be formed of the photosensitive resin composition of the present invention.

EXAMPLES

The present invention will be explained hereinbelow with reference to the examples.

Synthesis Example 1

While stirring, 2.34 g (0.018 mol) of 2-hydroxyethyl methacrylate was added to a solution consisting of 100 ml of dried N-methylpyrrolidone and 21.18 g (0.072 mol) of 3,3',4,4'-biphenyltetracarboxylic dianhydride in a closed reaction vessel having a stirrer, a thermometer, and a nitrogen gas feed pipe, and the resultant mixture was stirred at 70° C. for one hour, subsequently at room temperature overnight. To the resultant reaction solution was added dropwise over one hour a solution of 6.49 g (0.06 mol) of metaphenylenediamine and 0.25 g (0.001 mol) of 1,3-bis(3-aminopropyl)tetramethyldisiloxane in 80 ml of dried N-methylpyrrolidone in a closed reaction vessel having a stirrer, a thermometer, and a nitrogen gas feed pipe, followed by stirring at room temperature overnight. While stirring, to the resultant reaction solution was then added dropwise over one hour a solution of 29.92 g (0.145 mol) of N,N-dicyclohexylcarbodiimide in 100 ml of dried N-methylpyrrolidone. To the reaction solution was added 45.5 g (0.35 mol) of 2-hydroxyethyl methacrylate, and the resultant mixture was stirred at 50° C. for 5 hours, and subsequently at room temperature overnight. The resultant reaction mixture was diluted with 50 ml of acetone and unnecessary substances were removed from the mixture by suction filtration, and the resultant filtrate was treated by vigorously stirring in 2.0 L of ion-exchanged water. The solid precipitate was further washed with ion-exchanged water, subsequently with methanol, and subjected to suction drying on a filter and then subjected to vacuum drying until the moisture content thereof became less than 1.0% by weight at room temperature to obtain polymer P-1.

Synthesis Example 2

In a closed reaction vessel having a stirrer, a thermometer, and a nitrogen gas feed pipe, a solution consisting of 80 ml of dried N-methylpyrrolidone, 14.4 g (0.072 mol) of 4,4'-oxydianiline, and 0.63 g (0.008 mol) of pyridine was cooled to 0° C. To the solution was added dropwise 1.12 g (0.008 mol) of benzoyl chloride, followed by stirring at room temperature for 30 minutes, to obtain reaction solution A-1. 100 ml of dried N-methylpyrrolidone and 21.18 g (0.072 mol) of 3,3',4,4'-biphenyltetracarboxylic dianhydride were then added to another closed reaction vessel having a stirrer, a thermometer, and a nitrogen gas feed pipe, and, while stirring, the above-obtained reaction solution A-1 was added dropwise over 30 minutes. The resultant mixture was stirred at 50° C. for 5 hours, subsequently at room temperature overnight. The resultant reaction solution was cooled to 0° C., and 10.4 g (0.11 mol) of chloromethyl ethyl ether and 11.1 g (0.11 mol) of triethylamine were successively added dropwise to the solution over 30 minutes, followed by stirring at room temperature for 30 minutes. The resultant reaction mixture was treated by vigorously stirring in 2.0 L of ion-exchanged water. The solid precipitate was further washed with ion-exchanged water, and subjected to suction drying on a filter and then subjected to vacuum drying until the moisture content thereof became less than 1.0% by weight at room temperature to obtain polymer P-2.

Synthesis Example 3

31.0 g (0.1 mol) of bis(3,4-dicarboxyphenyl)ether dianhydride was added to 100 ml of dried N-methylpyrrolidone and 14.8 g (0.2 mol) of n-butanol in a closed reaction vessel having a stirrer, a thermometer, and a nitrogen gas feed pipe, and the resultant mixture was stirred at 70° C. for 24 hours to obtain an ester. The resultant solution was cooled to 0° C., and 23.8 g (0.2 mol) of thionyl chloride was added dropwise to the solution, followed by stirring for 30 minutes, to obtain reaction solution A-2. 100 ml of dried N-methylpyrrolidone, 33.0 g (0.09 mol) of 2,2-bis(3-amino-4-hydroxyphenyl)-1,1,1,3,3, 3-hexafluoropropane, and 15.82 g (0.2 mol) of pyridine were then added to another closed reaction vessel having a stirrer, a thermometer, and a nitrogen gas feed pipe, and the solids therein were dissolved by stirring. The resultant solution was cooled to 0° C., and the above-obtained reaction solution A-2 was added dropwise to the solution over 30 minutes, followed by stirring at room temperature for 30 minutes. The resultant reaction mixture was treated by vigorously stirring in 2.0 L of ion-exchanged water. The solid precipitate was further washed with ion-exchanged water, and subjected to suction drying on a filter and then subjected to vacuum drying until the moisture content thereof became less than 1.0% by weight at room temperature to obtain polymer P-3.

Synthesis Example 4

In a closed reaction vessel having a stirrer, a thermometer, and a nitrogen gas feed pipe, a solution consisting of 100 ml of dried N-methylpyrrolidone and 25.8 g (0.1 mol) of 4,4'-oxybis(carboxyphenyl) was cooled to 0° C., and 23.8 g (0.2 mol) of thionyl chloride was added dropwise to the solution, followed by stirring for 30 minutes, to obtain reaction solution A-3. In another closed reaction vessel having a stirrer, a thermometer, and a nitrogen gas feed pipe, a solution consisting of 100 ml of dried N-methylpyrrolidone, 36.6 g (0.1 mol) of 2,2-bis(3-amino-4-hydroxyphenyl)-1,1,1,3,3,3-hexafluoropropane, and 0.79 g (0.01 mol) of pyridine was cooled to 0° C., and 1.57 g (0.01 mol) of phenyl chloroformate was added dropwise to the solution, followed by stirring at room temperature for 30 minutes. 15.82 g (0.2 mol) of pyridine was added to the resultant mixture and cooled to 0° C., and then the above-obtained reaction solution A-3 was added dropwise to the mixture over 30 minutes, followed by stirring at room temperature for 30 minutes. The resultant reaction mixture was treated by vigorously stirring in 2.0 L of ion-exchanged water. The solid precipitate was further washed with ion-exchanged water, and subjected to suction drying on a filter and then subjected to vacuum drying until the moisture content thereof became less than 1.0% by weight at room temperature to obtain polymer P-4.

Synthesis Example 5

In a closed reaction vessel having a stirrer, a thermometer, and a nitrogen gas feed pipe, a solution consisting of 100 ml of dried N-methylpyrrolidone and 9.76 g (0.05 mol) of 1-methyl 2-aminoterephthalate was cooled to 0° C., and 8.85 g (0.05 mol) of benzenesulfonyl chloride was added dropwise to the solution, followed by stirring for 30 minutes. 15.82 g (0.2 mol) of pyridine was then added to the resultant mixture and stirred at room temperature for 30 minutes. The resultant reaction mixture was treated by vigorously stirring in 2.0 L of ion-exchanged water. The solid precipitate was further washed with ion-exchanged water, and subjected to suction drying on a filter and then subjected to vacuum drying until the moisture content thereof became less than 1.0% by weight at room temperature to obtain chain extender B-1 (for the sake of simplicity, component (B) is referred to hereinafter as "chain extender").

Synthesis Example 6

In a closed reaction vessel having a stirrer, a thermometer, and a nitrogen gas feed pipe, a solution consisting of 100 ml of dried N-methylpyrrolidone and 18.3 g (0.05 mol) of 2,2-bis(3-amino-4-hydroxyphenyl)-1,1,1,3,3,3-hexafluoropropane was cooled to 0° C., and 12.1 g (0.1 mol) of pivaloyl chloride was added dropwise to the solution, followed by stirring for 30 minutes. 15.82 g (0.2 mol) of pyridine was then added to the resultant mixture and stirred at room temperature for 30 minutes. The resultant reaction mixture was treated by vigorously stirring in 2.0 L of ion-exchanged water. The solid precipitate was further washed with ion-exchanged water, and subjected to suction drying on a filter and then subjected to vacuum drying until the moisture content thereof became less than 1.0% by weight at room temperature to obtain chain extender B-2.

Synthesis Example 7

In a closed reaction vessel having a stirrer, a thermometer, and a nitrogen gas feed pipe, a solution consisting of 100 ml of dried N-methylpyrrolidone and 7.6 g (0.05 mol) of 3,5-diaminobenzoic acid was cooled to 0° C., and 15.7 g (0.1 mol) of phenyl chloroformate was added dropwise to the solution, followed by stirring for 30 minutes. 15.82 g (0.2 mol) of pyridine was then added to the resultant mixture and stirred at room temperature for 30 minutes. The resultant reaction mixture was treated by vigorously stirring in 2.0 L of ion-exchanged water. The solid precipitate was further washed with ion-exchanged water, and subjected to suction drying on a filter and then subjected to vacuum drying until the moisture content thereof became less than 1.0% by weight at room temperature to obtain chain extender B-3.

Synthesis Example 8

In a closed reaction vessel having a stirrer, a thermometer, and a nitrogen gas feed pipe, a solution consisting of 100 ml of dried N-methylpyrrolidone and 25.9 g (0.05 mol) of 4",4'"-(hexafluoroisopropylidene)-bis(4-phenoxyaniline) was cooled to 0° C., and 16.4 g (0.1 mol) of diisopropylcarbamyl chloride was added dropwise to the solution, followed by stirring for 30 minutes. 15.82 g (0.2 mol) of pyridine was then added to the resultant mixture and stirred at room temperature for 30 minutes. The resultant reaction mixture was treated by vigorously stirring in 2.0 L of ion-exchanged water. The solid precipitate was further washed with ion-exchanged water, and subjected to suction drying on a filter and then subjected to vacuum drying until the moisture content thereof became less than 1.0% by weight at room temperature to obtain chain extender B-4.

Synthesis Example 9

In a closed reaction vessel having a stirrer, a thermometer, and a nitrogen gas feed pipe, a solution consisting of 100 ml of dried N-methylpyrrolidone and 6.86 g (0.05 mol) of 4-aminobenzoic acid was cooled to 0° C., and 3.93 g (0.05 mol) of acetyl chloride was added dropwise to the solution, followed by stirring for 30 minutes. 15.82 g (0.2 mol) of pyridine was then added to the resultant mixture and stirred at room temperature for 30 minutes. The resultant reaction mixture was treated by vigorously stirring in 2.0 L of ion-exchanged water. The solid precipitate was further washed with ion-exchanged water, and subjected to suction drying on a filter and then subjected to vacuum drying until the moisture content thereof became less than 1.0% by weight at room temperature to obtain chain extender B-5.

Synthesis Example 10

While cooling, 0.3 mol of triethylamine was added dropwise to a solution of 0.1 mol of tris(4-hydroxyphenyl)methane and 0.29 mol of naphthoquinone-1,2-diazido-4-sulfonyl chloride in 150 g of dioxane in a closed reaction vessel having a stirrer, a thermometer, and a nitrogen gas feed pipe to effect a reaction, and the resultant reaction mixture was subjected to filtration, and the filtrate was treated by vigorously stirring in 2.0 L of ion-exchanged water. The solid precipitate was further washed with ion-exchanged water, and subjected to suction drying on a filter and then subjected to vacuum drying until the moisture content thereof became less than 1.0% by weight at room temperature to obtain orthoquinonediazide compound C-1.

Example 1

100 g of P-1 obtained in the Synthesis Example 1, 140 g of N-methylpyrrolidone, and 0.3 g of p-methoxyphenol were placed in a three-necked flask having a stirrer, a thermometer, and a nitrogen gas feed pipe, and the solids therein were dissolved by stirring. To the resultant solution were added 6.0 g of 2,2'-bis(o-chlorophenyl)-4,4',5,5'-tetraphenylbiimidazole, 3.0 g of 2-mercaptobenzoxazole, 0.6 g of ethyl Michler's ketone as a sensitizer, 18.0 g of tetraethylene glycol diacrylate as an addition-polymerizable compound, and 5.0 g of chain extender B-1 obtained in the Synthesis Example, and the solids therein were dissolved by stirring at room temperature for about 24 hours, followed by filtration using a filter, to obtain a photosensitive resin composition solution. The solution obtained was applied onto a 5-inch silicon wafer by spin coating and then dried to form a 5.0±1.0 μm thick film. The film was then subjected to exposure with a pattern mask using an I-line stepper at a light exposure of 200 to 1000 mJ/cm$^2$. The resultant wafer was allowed to stand in a light shielded box for one hour, and then subjected to paddle development using γ-butyrolactone, thus obtaining an excellent relief pattern having a resolution as high as 10 μm (minimum line width) at a light exposure of 400 mJ/cm$^2$. The aforementioned solution was applied onto a 5-inch silicon wafer by spin coating and then dried to form an 18.0±1.0 μm thick film, and then, the film was subjected to exposure with a pattern mask using a contact aligner at a light exposure of 1000 mJ/cm$^2$. The resultant wafer was allowed to stand in a light shielded box for one hour, and then subjected to paddle development using γ-butyrolactone to obtain a 10 mm×120 mm strip pattern. The wafer was baked for cure in an oven filled with nitrogen gas at 320° C. for one hour to obtain a cured film. The strip thin film was peeled off the silicon wafer using an aqueous solution of hydrofluoric acid and dried, and then an elongation of the strip thin film was measured using an autograph. It was found that the elongation was 50%.

Example 2

The same procedure as in the Example 1 was repeated except that 5.0 g of chain extender B-2 obtained in the Synthesis Example 6 was used to give an excellent relief pattern having a resolution as high as 15 μm (minimum line width) at a light exposure of 450 mJ/cm$^2$. A strip thin film was obtained in accordance with the same procedure as in the Example 1, and an elongation of the strip thin film was measured using an autograph. It was found that the elongation was 70%.

Example 3

The same procedure as in the Example 1 was repeated except that 5.0 g of chain extender B-3 obtained in the Synthesis Example 7 was used to give an excellent relief pattern having a resolution as high as 15 μm (minimum line width) at a light exposure of 450 mJ/cm$^2$. A strip thin film was obtained in accordance with the same procedure as in the Example 1, and an elongation of the strip thin film was measured using an autograph. It was found that the elongation was 55%.

Example 4

The same procedure as in the Example 1 was repeated except that 5.0 g of chain extender B-4 obtained in the Synthesis Example 8 was used to give an excellent relief pattern having a resolution as high as 15 μm (minimum line width) at a light exposure of 500 mJ/cm$^2$. A strip thin film was obtained in accordance with the same procedure as in the Example 1, and an elongation of the strip thin film was measured using an autograph. It was found that the elongation was 55%.

Example 5

100 g of P-2 obtained in the Synthesis Example 2 and 140 g of N-methylpyrrolidone were placed in a three-necked flask having a stirrer, a thermometer, and a nitrogen gas feed pipe, and the solids therein were dissolved by stirring. To the resultant solution were added 5.0 g of p-nitrobenzyl-9,10-dimethoxyanthracene-2-sulfonate and 5.0 g of chain extender B-1 obtained in the Synthesis Example 5, and the solids therein were dissolved by stirring at room temperature for about 24 hours, followed by filtration using a filter, to obtain a photosensitive resin composition solution. The solution was treated in accordance with the same procedure as in the Example 1 except that, after the exposure, the wafer was heated at 120° C. for 60 seconds by a hot plate and then subjected to paddle development using a 2.38% aqueous solution of tetramethylammonium hydroxide, to give an excellent relief pattern having a resolution as high as 15 μm (minimum line width) at a light exposure of 800 mJ/cm$^2$. A strip thin film was obtained in accordance with the same procedure as in the Example 1 except that, after the exposure, the wafer was heated at 120° C. for 60 seconds by a hot plate and then subjected to paddle development using a 2.38% aqueous solution of tetramethylammonium hydroxide, and an elongation of the strip thin film was measured using an autograph. It was found that the elongation was 40%.

Example 6

The same procedure as in the Example 5 was repeated except that 5.0 g of chain extender B-2 obtained in the Synthesis Example 6 was used to give an excellent relief pattern having a resolution as high as 20 μm (minimum line width) at a light exposure of 900 mJ/cm$^2$. A strip thin film was obtained in accordance with the same procedure as in the Example 5, and an elongation of the strip thin film was measured using an autograph. It was found that the elongation was 40%.

Example 7

The same procedure as in the Example 5 was repeated except that 5.0 g of chain extender B-3 obtained in the Synthesis Example 7 was used to give an excellent relief pattern having a resolution as high as 20 μm (minimum line width) at a light exposure of 900 mJ/cm$^2$. A strip thin film was obtained in accordance with the same procedure as in the Example 5, and an elongation of the strip thin film was measured using an autograph. It was found that the elongation was 45%.

Example 8

100 g of P-3 obtained in the Synthesis Example 3 and 140 g of N-methylpyrrolidone were placed in a three-necked flask having a stirrer, a thermometer, and a nitrogen gas feed pipe, and the solids therein were dissolved by stirring. To the resultant solution were added 6.0 g of sensitizer C-1 obtained in the Synthesis Example 10 and 5.0 g of chain extender B-1 obtained in the Synthesis Example 5, and the solids therein were dissolved by stirring at room temperature for about 24 hours, followed by filtration using a filter, to obtain a photosensitive resin composition solution. The solution was treated in accordance with the same procedure as in the Example 1 except that a 2.38% aqueous solution of tetramethylammonium hydroxide was used in the paddle development to give an excellent relief pattern having a resolution as high as 10 μm (minimum line width) at a light exposure of 400 mJ/cm$^2$. A strip thin film was obtained in accordance with the same procedure as in the Example 1 except that a 2.38% aqueous solution of tetramethylammonium hydroxide was used in the paddle development, and an elongation of the strip thin film was measured using an autograph. It was found that the elongation was 40%.

Example 9

The same procedure as in the Example 8 was repeated except that 5.0 g of chain extender B-3 obtained in the Synthesis Example 7 was used as a chain extender to give an excellent relief pattern having a resolution as high as 10 μm (minimum line width) at a light exposure of 400 mJ/cm$^2$. A strip thin film was obtained in accordance with the same procedure as in the Example 8, and an elongation of the strip thin film was measured using an autograph. It was found that the elongation was 50%.

Example 10

The same procedure as in the Example 8 was repeated except that 5.0 g of chain extender B-4 obtained in the Synthesis Example 8 was used as a chain extender to give an excellent relief pattern having a resolution as high as 10 μm (minimum line width) at a light exposure of 400 mJ/cm$^2$. A strip thin film was obtained in accordance with the same procedure as in the Example 8, and an elongation of the strip thin film was measured using an autograph. It was found that the elongation was 50%.

Example 11

100 g of P-4 obtained in the Synthesis Example 4 and 140 g of N-methylpyrrolidone were placed in a three-necked flask having a stirrer, a thermometer, and a nitrogen gas feed pipe, and the solids therein were dissolved by stirring. To the resultant solution were added 6.0 g of sensitizer C-1 obtained in the Synthesis Example 10 and 5.0 g of chain extender B-4 obtained in the Synthesis Example 8, and the solids therein were dissolved by stirring at room temperature for about 24 hours, followed by filtration using a filter, to obtain a photosensitive resin composition solution. The solution was treated in accordance with the same procedure as in the Example 1 except that a 2.38% aqueous solution of tetramethylammonium hydroxide was used in the paddle development to give an excellent relief pattern having a resolution as high as 10 μm (minimum line width) at a light exposure of 350 mJ/cm$^2$. A strip thin film was obtained in accordance with the same procedure as in the Example 1 except that a 2.38% aqueous solution of tetramethylammonium hydroxide was used in the paddle development, and an elongation of the strip thin film was measured using an autograph. It was found that the elongation was 70%.

Example 12

The same procedure as in the Example 11 was repeated except that 5.0 g of chain extender B-5 obtained in the Synthesis Example 9 was used to give an excellent relief pattern having a resolution as high as 10 μm (minimum line width) at a light exposure of 400 mJ/cm$^2$. A strip thin film was obtained in accordance with the same procedure as in the Example 11, and an elongation of the strip thin film was measured using an autograph. It was found that the elongation was 55%.

Comparative Example 1

The same procedure as in the Example 1 was repeated except that chain extender B-1 obtained in the Synthesis Example 5 was not used to give an excellent relief pattern having a resolution as high as 15 μm (minimum line width) at a light exposure of 400 mJ/cm$^2$. A strip thin film was obtained in accordance with the same procedure as in the Example 1, and an elongation of the strip thin film was measured using an autograph. It was found that the elongation was 30%.

Comparative Example 2

The same procedure as in the Example 4 was repeated except that chain extender B-2 obtained in the Synthesis Example 6 was not used to give an excellent relief pattern having a resolution as high as 20 μm (minimum line width) at a light exposure of 900 mJ/cm$^2$. A strip thin film was obtained in accordance with the same procedure as in the Example 4, and an elongation of the strip thin film was measured using an autograph. It was found that the elongation was 15%.

Comparative Example 3

The same procedure as in the Example 6 was repeated except that chain extender B-1 obtained in the Synthesis Example 5 was not used to give an excellent relief pattern having a resolution as high as 10 μm (minimum line width) at a light exposure of 400 mJ/cm$^2$. A strip thin film was obtained in accordance with the same procedure as in the Example 6, and an elongation of the strip thin film was measured using an autograph. It was found that the elongation was 10%.

Comparative Example 4

The same procedure as in the Example 8 was repeated except that chain extender B-4 obtained in the Synthesis Example 8 was not used to give an excellent relief pattern having a resolution as high as 10 μm (minimum line width) at a light exposure of 400 mJ/cm$^2$. A strip thin film was obtained in accordance with the same procedure as in the Example 8, and an elongation of the strip thin film was measured using an autograph. It was found that the elongation was 30%.

The combinations of the photosensitive polymers and chain extenders, the photosensitive properties, and the results of the measurement of elongation are shown in Table 1 below.

TABLE 1

| No. | Polymer | Chain extender | Sensitivity (mJ/cm$^2$) | Resolution (μm) | Elongation (%) |
|---|---|---|---|---|---|
| Example 1 | P-1 | B-1 | 400 | 10 | 50 |
| Example 2 | P-1 | B-2 | 450 | 15 | 70 |
| Example 3 | P-1 | B-3 | 450 | 15 | 55 |
| Example 4 | P-1 | B-4 | 500 | 15 | 55 |
| Example 5 | P-2 | B-1 | 800 | 15 | 40 |

TABLE 1-continued

| No. | Polymer | Chain extender | Sensitivity (mJ/cm$^2$) | Resolution (μm) | Elongation (%) |
|---|---|---|---|---|---|
| Example 6 | P-2 | B-2 | 900 | 20 | 40 |
| Example 7 | P-2 | B-3 | 900 | 20 | 45 |
| Example 8 | P-3 | B-1 | 400 | 10 | 40 |
| Example 9 | P-3 | B-3 | 400 | 10 | 50 |
| Example 10 | P-3 | B-4 | 400 | 10 | 50 |
| Example 11 | P-4 | B-4 | 350 | 10 | 70 |
| Example 12 | P-4 | B-5 | 400 | 10 | 55 |
| Comparative Example 1 | P-1 | None | 400 | 15 | 30 |
| Comparative Example 2 | P-2 | None | 900 | 20 | 15 |
| Comparative Example 3 | P-3 | None | 400 | 10 | 10 |
| Comparative Example 4 | P-4 | None | 400 | 10 | 30 |

INDUSTRIAL APPLICABILITY

The present invention provides a resin composition comprising a photosensitive polyimide precursor, polybenzoxazole precursor, polyimide, or polybenzoxazole capable of forming a cured resin having excellent properties, a copolymer thereof, or a mixture thereof; a method for forming a pattern using the resin composition; and an electronic part having an electronic device having the pattern.

The invention claimed is:

1. A photosensitive resin composition comprising:

(A) a polymer having an acid functional group and/or a substituent derived therefrom;

(B) a compound represented by the general formula (10):

$$X—(NR_4R_5)_n \quad (10)$$

wherein X represents an n-valent organic group, n represents an integer of 2 to 6, and each of $R_4$ and $R_5$ represents hydrogen or a monovalent organic group, at least one of $R_4$ and $R_5$ is selected from the group consisting of:

(7)

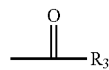

(8)

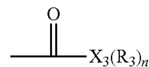

(9)

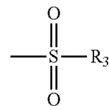

wherein $R_3$ represents a monovalent organic group; $X_3$ represents an oxygen, sulfur, or nitrogen atom; and n represents 1 when $X_3$ is an oxygen atom or a sulfur atom, or n represents 2 when $X_3$ is a nitrogen atom;

(C) a photoreactive compound; and (D) a solvent, wherein said polymer (A) is a heat-resistant polymer, and wherein the heat-resistant polymer is a polyimide precursor represented by the general formula (1) below or polyimide derived from the precursor, a polybenzoxazole precursor represented by the general formula (2) below or polybenzoxazole derived from the precursor, a copolymer thereof, or a mixture thereof:

(1)

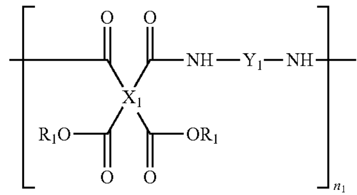

wherein $X_1$ represents a tetravalent organic group, $Y_1$ represents a divalent organic group, $R_1$ represents hydrogen or a monovalent organic group, and $n_1$ represents an integer of 2 to 500 corresponding to the number of the repeating units of the polymer, (2)

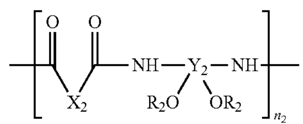

wherein $X_2$ represents a divalent organic group, $Y_2$ represents a tetravalent organic group, of which two valences are used in bonding to hydroxyl groups, $R_2$ represents hydrogen or a monovalent organic group, and $n_2$ represents an integer of 2 to 500 corresponding to the number of the repeating units of the polymer.

2. The photosensitive resin composition according to claim 1, wherein the compound of the component (B) further has at least one acid functional group and/or substituent derived therefrom.

3. The photosensitive resin composition according to claim 1, wherein the component (B) further has at least one acid functional group and/or substituent derived therefrom.

4. The photosensitive resin composition according to claim 3, wherein the component (B) has one substituent or two substituents derived from an amine functional group and has one acid functional group and/or substituent derived therefrom.

5. The photosensitive resin composition according to claim 1, wherein the acid functional group in the polymer (A) is a carboxyl group and/or a phenolic hydroxyl group.

6. A method for forming a pattern, comprising:

a step of applying the photosensitive resin composition according to claim 1 onto a substrate and drying it;

a step of subjecting the applied and dried photosensitive resin film to light exposure;

a step of subjecting the exposed photosensitive resin film to development using an alkaline aqueous solution; and a step of subjecting the pattern obtained in the development to heat treatment.

7. An electronic part having an electronic device having the pattern obtained by the method according to claim 6, wherein the pattern is an interlayer dielectric layer and/or a surface protecting film layer.

8. The photosensitive resin composition according to claim 1, wherein said $R_3$ is a monovalent organic group having 1 to 20 carbon atoms.

9. The photosensitive resin composition according to claim 1, wherein said compound of the component (B) serves as a chain extender capable of increasing molecular weight of said polymer of the component (A) during a heat treatment of the photosensitive resin composition.

10. The photosensitive resin composition according to claim 1, which contains 0.05 to 50 parts by weight of said compound of the component (B) relative to 100 parts by weight of said polymer of the component (A).

11. The photosensitive resin composition according to claim 1, which contains 0.2 to 20 parts by weight of said compound of the component (B) relative to 100 parts by weight of said polymer of the component (A).

12. The photosensitive resin composition according to claim 1, wherein said polymer (A) has an acid functional group.

13. The photosensitive resin composition according to claim 1, wherein $R_3$ is selected from the group consisting of methyl, ethyl, propyl, isopropyl, n-butyl, s-butyl, t-butyl, cyclopropenyl, cyclobutyl, cyclopentyl, cyclohexyl, cyclohexylmethyl, cyclohexenyl, norbornyl, norbornenyl, adamantyl, benzyl, p-nitrobenzyl, trifluoromethyl, methoxymethyl, ethoxyethyl, methoxymethyl, ethoxymethyl, methoxyethoxymethyl, benzoxymethyl, ethoxytetrahydropyranyl, tetrahydrofuranyl, 2-trimethylsilylethoxymethyl, trimethylsilyl, t-butyldimethylsilyl, 3-oxocyclohexyl, 9-fluorenylmethyl, methylthiomethyl, phenyl, toluyl, xylyl, 9,10-dihydroanthranyl, trimethylphenyl, pentamethylphenyl, biphenyl, terphenyl, quterphenyl, dimethylbiphenyl, naphthalenyl, methylnaphthalenyl, fluorenyl, fluorophenyl, fluorobiphenyl, isopropylidenebiphenyl, tetrafluoroisopropylidenebiphenyl, benzyl phenyl ether, phenyl ether, phenoxytoluoyl, methoxybiphenyl, dimethoxybiphenyl, methoxynaphthalenyl, dimethoxynaphthalenyl, and nitrophenyl.

* * * * *